United States Patent
Abe (10) Patent No.: US 6,797,965 B2
(45) Date of Patent: Sep. 28, 2004

(54) CHARGED PARTICLE BEAM APPARATUS, PATTERN MEASURING METHOD, AND PATTERN DRAWING METHOD

(75) Inventor: Hideaki Abe, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 23 days.

(21) Appl. No.: 10/252,510

(22) Filed: Sep. 24, 2002

(65) Prior Publication Data

US 2003/0075691 A1 Apr. 24, 2003

(30) Foreign Application Priority Data

Sep. 25, 2001 (JP) ........................................ 2001-291223

(51) Int. Cl.⁷ ............................ G01J 1/00; G01N 21/00
(52) U.S. Cl. ................. 250/491.1; 250/310; 250/492.1; 250/492.2; 250/492.21
(58) Field of Search ........................... 250/491.1, 492.1, 250/492.2, 492.21, 310

(56) References Cited

U.S. PATENT DOCUMENTS

| | | |
|---|---|---|
| 5,986,263 A | 11/1999 | Hiroi et al. |
| 6,107,637 A | 8/2000 | Watanabe et al. |
| 6,414,325 B1 * | 7/2002 | Yamada et al. ........... 250/491.1 |
| 6,465,781 B1 * | 10/2002 | Nishimura et al. ......... 250/306 |
| 6,512,228 B2 * | 1/2003 | Todokoro et al. ........... 250/310 |
| 6,515,277 B1 * | 2/2003 | Kley .......................... 250/234 |
| 6,531,697 B1 * | 3/2003 | Nakamura et al. .......... 250/311 |

FOREIGN PATENT DOCUMENTS

| | | |
|---|---|---|
| JP | 11-149895 | 6/1999 |
| JP | 11-183154 | 7/1999 |
| JP | 2000-223392 | 8/2000 |
| JP | 2000-173528 | 6/2002 |

* cited by examiner

*Primary Examiner*—John R. Lee
*Assistant Examiner*—Paul M. Gurzo
(74) *Attorney, Agent, or Firm*—Finnegan, Henderson, Farabow, Garrett & Dunner, L.L.P.

(57) ABSTRACT

A charged particle beam apparatus includes a charged particle source which generates a charged particle beam, a condenser lens which converges the charged particle beam, a deflector which deflects the charged particle beam to scan a sample with the charged particle beam, an objective lens which converges the charged particle beam on the surface of the sample, a sample position imaginary variation detection part which detects an imaginary variation of a sample position caused by variation of the focal position of the charged particle beam due to variation in the potential of the sample, and a sample position imaginary variation compensation part which compensates for the detected imaginary variation of the sample position.

17 Claims, 7 Drawing Sheets

CHARGED PARTICLE BEAM APPARATUS, PATTERN MEASURING METHOD, AND PATTERN DRAWING METHOD

CROSS REFERENCE TO RELATED APPLICATION

This application claims benefit of priority under 35USC §119 to Japanese patent application No. 2001-291223, filed on Sep. 25, 2001, the contents of which are incorporated by reference herein.

BACKGROUND OF THE INVENTION

1. Field of the Invention

The present invention relates to a charged particle beam apparatus, a pattern measuring method and a pattern drawing method.

2. Description of the Prior Art

A charged particle beam apparatus is widely used in a semiconductor fabricating process as a scanning electron microscope which observes a pattern formed on a semiconductor wafer and an electron beam lithography apparatus which draws a pattern on a semiconductor wafer. In using such a charged particle beam apparatus, prior to observation and drawing, the focal position of a charged particle beam may be fine-adjusted to decide a measuring position and a patterning position. In a prior art, a height detector of an optical type or an electrostatic capacity type is used to detect a height of a sample surface, and a calibration parameter of the detected sample height and the focal position of a charged particle beam is calculated to set a focus control current or a focus control voltage so that the charged particle beam is focused on the sample surface, thereby coarse-adjusting the focal position.

As an example of a prior art apparatus and method which coarse-adjust a focal position, there is Japanese patent application Laid-Open No. 1999-149895. Japanese patent application Laid-Open No. 1999-149895 discloses a height detector which detects the position of a lattice-like light flux reflected from the surface of a sample by projecting the lattice-like light flux onto the sample from above the sample in a slanting direction to measure the height of the surface of the sample from a change of the position; focus control means which converges an electron beam on the surface of the sample based on the measured height of the surface of the sample; and deflection control means which calibrates image distortion including a magnification error of an electron beam image caused based on the focus control.

A charged particle beam apparatus typically has a sample stage which supports and/or fixes a sample. To stabilize the incident voltage of a charged particle beam onto the sample, a ground or a constant voltage is applied to the sample stage. This holds the potential of the sample constant.

However, there is a case in which a suitable voltage cannot be applied to the sample since the periphery of the sample is covered by an insulator film or a case in which the irradiated region can be electrically charged by irradiation of the charged particle beam so that the potential of the sample can be varied locally. In such cases, magnification variation becomes a problem. This point will be described by taking an electron beam apparatus as an example of a charged particle beam apparatus with reference to FIGS. 6 to 7B. In the following drawings, like parts are indicated by the same reference numerals and repetitive descriptions thereof are suitably omitted.

Figure 6:
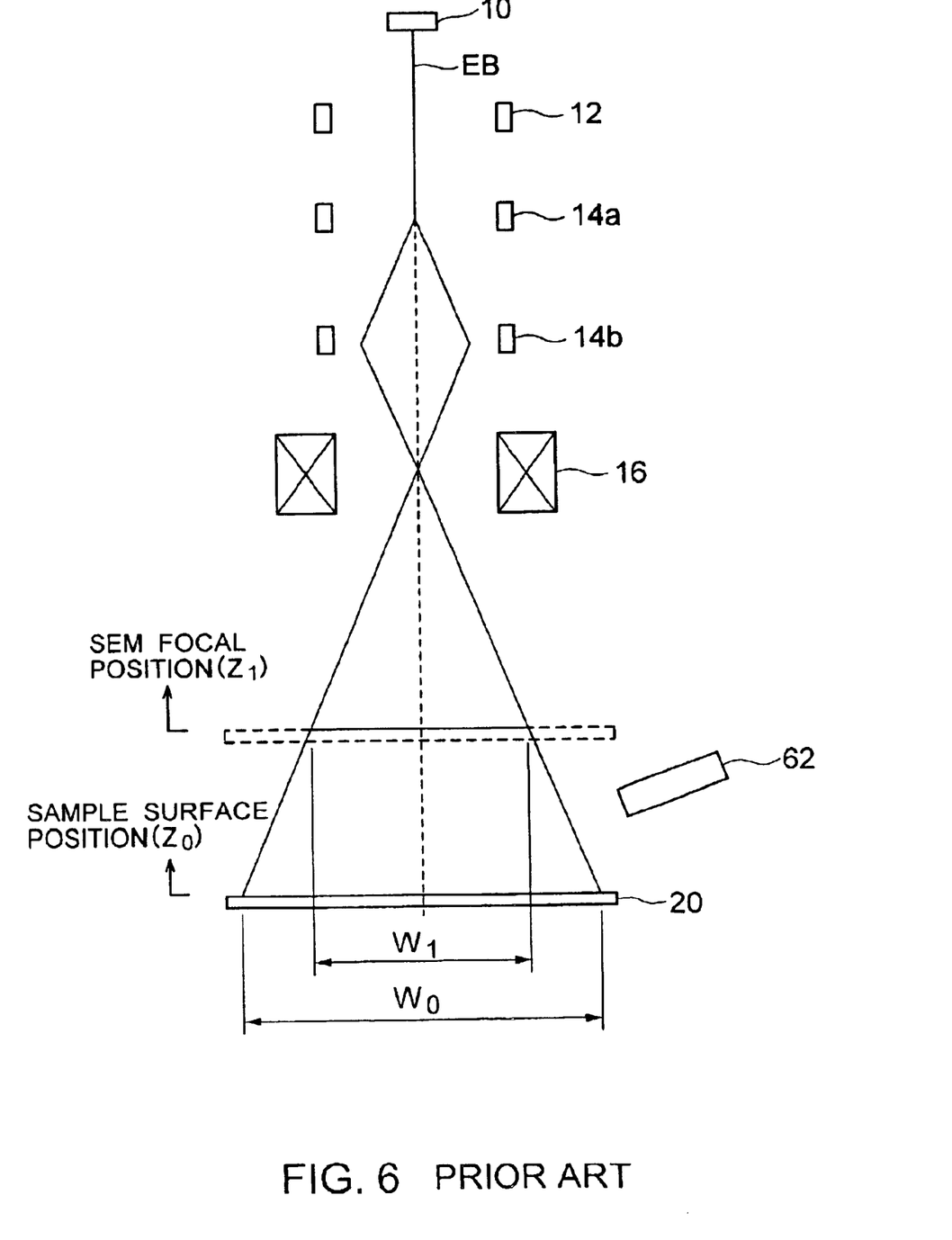
FIG. 6 is a block diagram for explaining problems in a prior art electron beam apparatus.
Figure 7A:
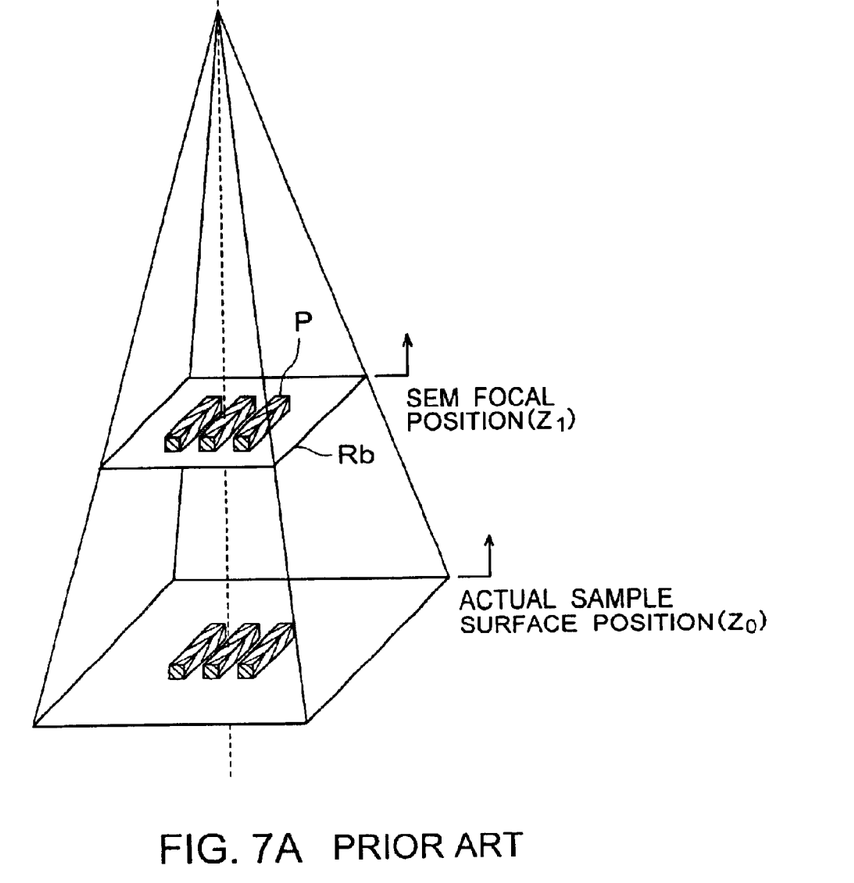
FIGS. 7A and 7B are drawings showing distortion of an electron beam image caused by the prior art.
Figure 7B:
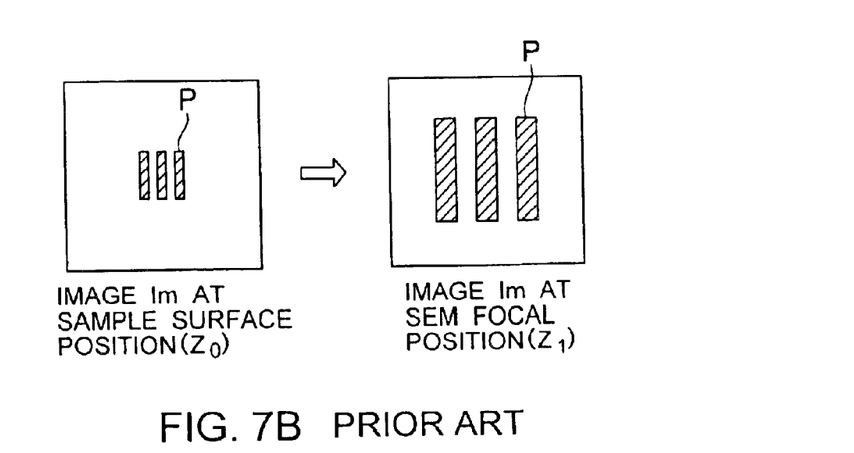

FIG. 6 is a block diagram for explaining problems in the prior art electron beam apparatus. The drawing shows that deviation between a sample surface position obtained by a sample height detector and an electron beam focal position results in a magnification error. Electron beam EB produced from an electron beam generation source 10 is converged by a condenser lens 12, which is then deflected by two deflectors 14a, 14b to be focused so as to focus on the surface of a sample 20 by an objective lens 16. The potential of the sample 20 is typically constant. The electron beam EB is focused on the surface of the sample. The sample surface position obtained from the height detector of an optical type or an electrostatic capacity type is thus matched with the electron beam focal position (The sample position is referred to as $Z_0$). When the sample potential is varied, however, the incident voltage onto a sample 20 is changed due to the influence. There occurs deviation between the sample surface position $Z_0$, and the electron beam focal position (The electron beam focal position is referred to as $Z_1$). Specifically, along with the variation in the sample potential, the sample position is changed imaginarily. The focus control current of the objective lens 16 is varied from the original current value $I_0$ to $I_1$ corresponding to the imaginary position. In accordance with this, the deflection width of the electron beam EB is varied from the original width W0 to width W1. Image distortion including a magnification error is thus caused as long as the magnification compensation of an electron beam image is not properly performed, even if the focal position of the electron beam EB can be detected in this state. FIGS. 7A and 7B show distortion of the electron beam image caused by the deviation of the sample position. When the electron beam image is used to measure the size of pattern P, the case in which a voltage is applied properly to the sample 20 (Ra) and the case in which a voltage is not applied properly to the sample 20 (Rb) are largely different in the size of the irradiated region of the electron beam EB, as shown in FIG. 7A. As a result the magnification of the electron beam image obtained from a secondary electron detector 62 and a SEM image signal processing part 64 (see FIG. 6) is varied. That is, as is apparent from the contrast of image Im ($Z_0$) with image Im ($Z_1$) shown in FIG. 7B, the size of the pattern P displayed on the screen is varied. As a result, the measured value is changed so that sufficient measurement reproducibility cannot be obtained.

To properly apply a voltage to the sample 20, there is a method in which removes the insulator film of the periphery of the sample 20. However, the sample can be scratched and dust can be produced. In consideration of these, this method is lacking in practicality.

BRIEF SUMMARY OF THE INVENTION

According to a first aspect of the present invention, there is provided a charged particle beam apparatus comprising: a charged particle source which generates a charged particle beam; a condenser lens which converges the charged particle beam; a deflector which deflects the charged particle beam to scan a sample with the charged particle beam; an objective lens which converges the charged particle beam on the surface of the sample; a sample position imaginary variation detection part which detects an imaginary variation of a sample position in height caused by variation of the focal position of the charged particle beam due to variation in the potential of the sample; and a sample position imaginary variation compensation part which compensates for the detected imaginary variation of the sample position.

According to a second aspect of the present invention, there is provided a pattern measuring method using a charged particle beam apparatus, the charged particle beam apparatus comprising, a charged particle source which generates a charged particle beam, a condenser lens which converges the charged particle beam, deflector which deflects the charged particle beam for scanning a sample with the charged particle beam, an objective lens which converges the charged particle beam on the surface of the sample, and a measuring part which measures a pattern formed on the surface of the sample on the basis of a secondary charged particle or a reflective charged particle which are produced from the surface of the sample by irradiation of the charged particle beam, the method comprises: detecting an imaginary variation of a sample position caused by variation of the focal position of the charged particle beam due to variation in the potential of the sample; and compensating for the imaginary variation of the sample position.

According to a third aspect of the present invention, there is provided a method for writing a pattern on a surface of a sample using a charged particle beam apparatus, the charged particle beam apparatus comprising a charged particle source which generates a charged particle beam, a condenser lens which converges the charged particle beam, a deflector which deflects the charged particle beam to scan the sample with the charged particle beam, and an objective lens which converges the charged particle beam on the surface of the sample, the method comprises: adjusting a focal position of the charged particle beam by adjusting a current or a voltage given to the objective lens to search the focal position of the charged particle beam and obtaining a focus control current value or a focus control voltage value for the objective lens when the charged particle beam is focused on the surface of the sample, as a first focus control current value or a first focus control voltage value, respectively; detecting the height of the surface of the sample; calculating a focus control current value or a focus control voltage value given to the objective lens when a focal position of the charged particle beam corresponds to the detected height of the surface of the sample, as a second current value or a second voltage value, respectively; calculating a focus control current difference which is a difference between the first focus control current value and the second focus control current value or a focus control voltage difference which is a difference between the first focus control voltage value and the second focus control voltage value; calculating a magnification variation of the charged particle beam on the basis of the focus control current difference or the focus control voltage differential; and generating a deflection control signal as a compensation signal which compensates for a control signal to the deflectors corresponding to the calculated magnification variation; and writing a pattern on the sample with the charged particle beam while compensating for the deflection amount of the deflectors on the basis of the deflection control signal.

DETAILED DESCRIPTION OF THE INVENTION

Some embodiments of the present invention will be described below with reference to the drawings. The following embodiments will be described by taking electron beam apparatuses using an electron beam as a charged particle beam. The present invention is not limited to these electron beam apparatuses, and can be naturally applied to an ion beam apparatus using an ion beam as a charged particle beam.

(1) First Embodiment of Charged Particle Beam Apparatus

Figure 1:
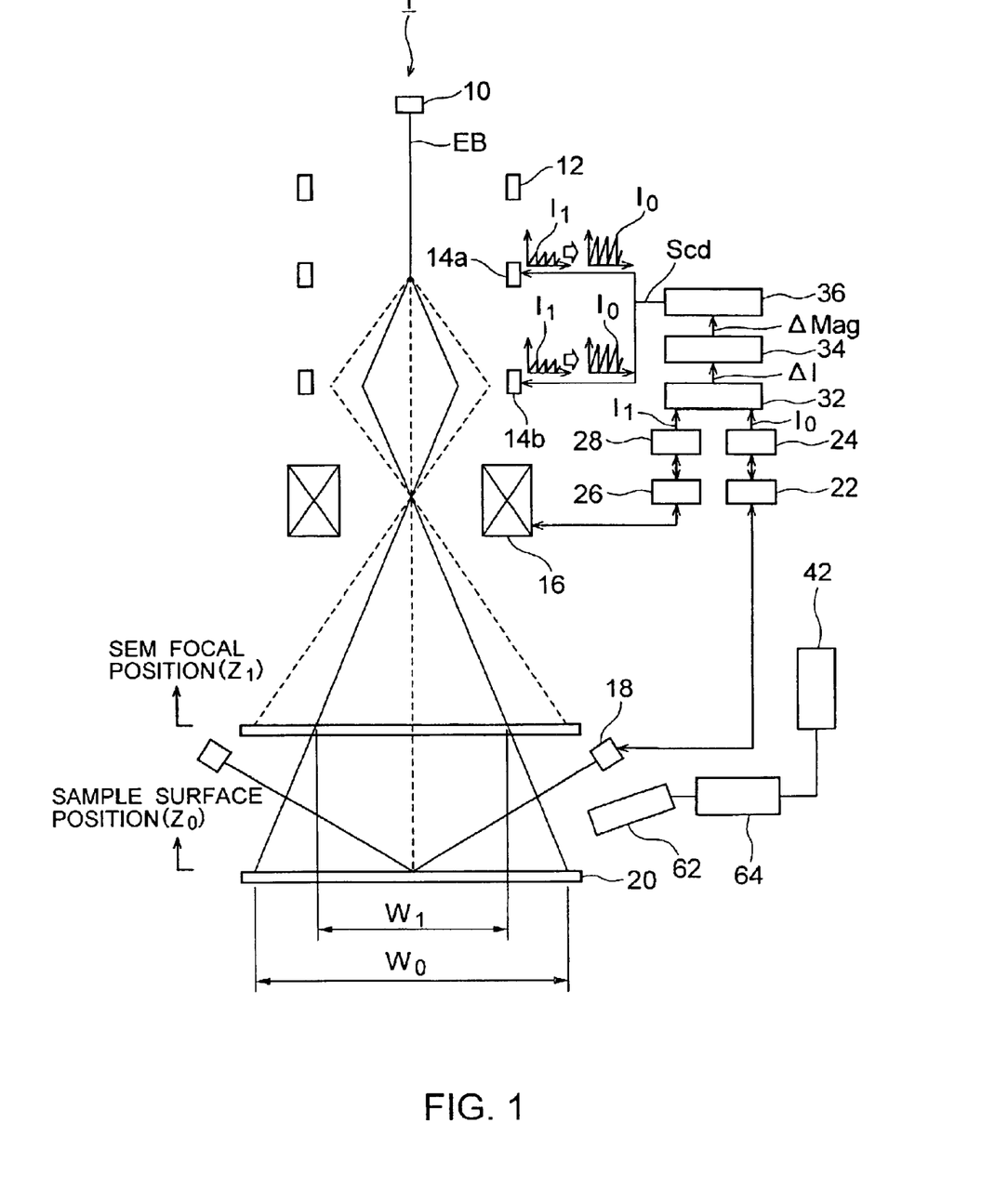
FIG. 1 is a block diagram showing the schematic construction of a first embodiment of a charged particle beam apparatus according to the present invention.

FIG. 1 is a block diagram showing the schematic construction of a first embodiment of a charged particle beam apparatus according to the present invention. An electron beam apparatus 1 shown in the drawing has, in addition to the construction of the electron beam apparatus shown in FIG. 6, a sample height detector 18, a height detector control part 22, a focus control current calculation part 24, a focus control current control part 26, a focal position detection part 28, a focus control current differential calculation part 32, a magnification variation calculation part 34, a deflection control part 36, and a pattern measuring part 42.

The sample height detector 18 is constructed by a height detector of an optical type or an electrostatic capacity type and detects position $Z_0$ of the surface of a sample 20 upon reception of a command signal from the height detection control part 22. The focus control current calculation part 24 receives information of the sample surface position $Z_0$ obtained by the sample height detector 18 and calculates focus control current (exciting current) $I_0$ of an objective lens 16 at the position $Z_0$ on basis of the relation between a previously prepared sample surface position and the focus control current of the objective lens 16. The focal position detection part 28 supplies a control signal to the focus control current control part 26 to detect focal position $Z_1$ of an electron beam EB while changing the focus control current, and sets focus control current $I_1$ in which the objective lens 16 focuses the electron beam EB at the position $Z_1$. The focus control current differential calculation part 32 calculates difference $\Delta I$ between the focus control current $I_0$ and the focus control current $I_1$. The magnification variation calculation part 34 receives information of the difference $\Delta I$ from the focus control current differential calculation part 32 to calculate magnification variation $\Delta Mag$ using a previously prepared calibration parameter. The calibration parameter is obtained from the relation between the focus control current value and the deflection amount. The deflection control part 36 receives information of the magnification variation $\Delta Mag$ from the focus control current differential calculation part 34 and generates deflection control signal Scd corresponding to the variation $\Delta Mag$ to supply it to deflectors 14a, 14b, compensating for the deflection amount.

The charged particle beam apparatus 1 of this embodiment thus compensates for the deflection amount of the deflectors 14a, 14b corresponding to the magnification error due to the imaginary variation of the sample position caused by the variation in potential of the sample. Therefore, for example in measuring a pattern size, stable and high-precision measurement can be realized. In addition, when the objective lens 16 is an electrostatic lens, the charged particle beam apparatus can be adapted by controlling a lens applied voltage in place of the exciting current. This point is the same in the later-described embodiment.

(2) First Embodiment of Pattern Measuring Method

A pattern measuring method using the electron beam apparatus 1 shown in FIG. 1 will be described as the first embodiment of a pattern measuring method according to the present invention with reference to FIG. 2.

Figure 2:
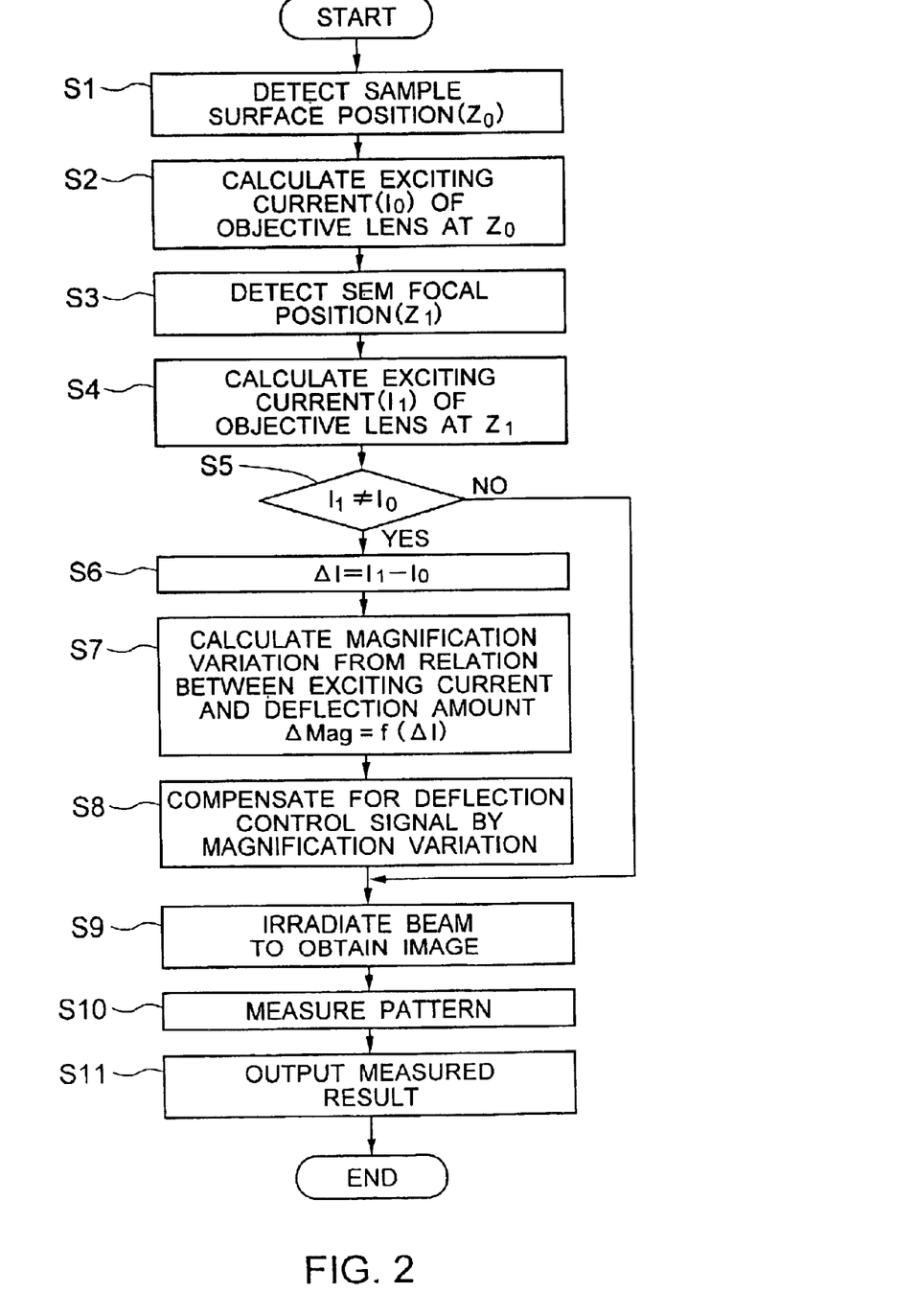
FIG. 2 is a flowchart showing the schematic steps of a first embodiment of a pattern measuring method according to the present invention.

FIG. 2 is a flowchart showing the schematic steps of the pattern measuring method of this embodiment.

First, the sample surface position $Z_0$ is detected by the sample height detector 18 (step S1).

Next, the exciting current $I_0$ of the objective lens 16 at the sample surface position $Z_0$ is calculated by the focus control current calculation part 24 on the based of the relation between the sample surface position and the focus control current of the objective lens 16 (step S2).

The focal position $Z_1$ of the electron beam EB is then detected by the focal position detection part 28 while the focus control current of the objective lens 16 is being changed (step S3), the exciting current $I_1$ of the objective lens 16 at the position $Z_1$ being calculated (step S4).

Next, the focus control current $I_0$ is compared with the focus control current $I_1$ by the focus control current differential calculation part 32 (step S5). In the case of $I_1=I_0$, it can be determined that no magnification error is caused. While the exciting current $(I_1=I_0)$ is fed to the objective lens 16, the electron beam EB is irradiated to obtain an electron beam image (step S9). A pattern is measured (step S10) and the measured result is outputted (step S11).

On the other hand, in the case of $I_1 \neq I_0$, magnification compensation is performed. First, its difference $\Delta I$ $(I_1-I_0)$ is calculated by the focus control current differential calculation part 32 (step S6). Then, magnification variation $\Delta Mag$ $(=f \Delta(I))$ corresponding to the difference $\Delta I$ on the basis of the relation between the value of the exciting current and the deflection amount is calculated using the prepared calibration parameter by the magnification variation calculation part 34 (step S7). Deflection control signal Scd corresponding to the magnification variation $\Delta Mag$ is generated by the deflection control part 36 to be supplied to the deflectors 14a, 14b, thereby the deflection amount is compensated by the magnification variation $\Delta Mag$(step S8). When the deflection amount at the focal position is for example W1, the deflection amount of the electron beam EB is compensated from the deflection amount W1 to the deflection amount W0 corresponding to the sample surface position. As a result, the observation magnification is the same as in the case in which the sample position is not varied imaginarily. Thereafter, while the deflection control signal Scd corresponding to the magnification variation $\Delta Mag$ is supplied to the deflectors 14a, 14b, the electron beam EB is irradiated to obtain an electron beam image of the pattern by a secondary electron detector 62 and a SEM image signal processing part 64 (step S9). the size of a pattern is measured by the pattern measuring part 42 on the basis of the electron beam image (step S10) and the measured result is outputted (step S11).

(3) An Embodiment of a Pattern Drawing Method

A pattern drawing method using the electron beam apparatus 1 shown in FIG. 1 wilt be described below as an embodiment of a pattern drawing method according to the present invention with reference to FIG. 3.

Figure 3:
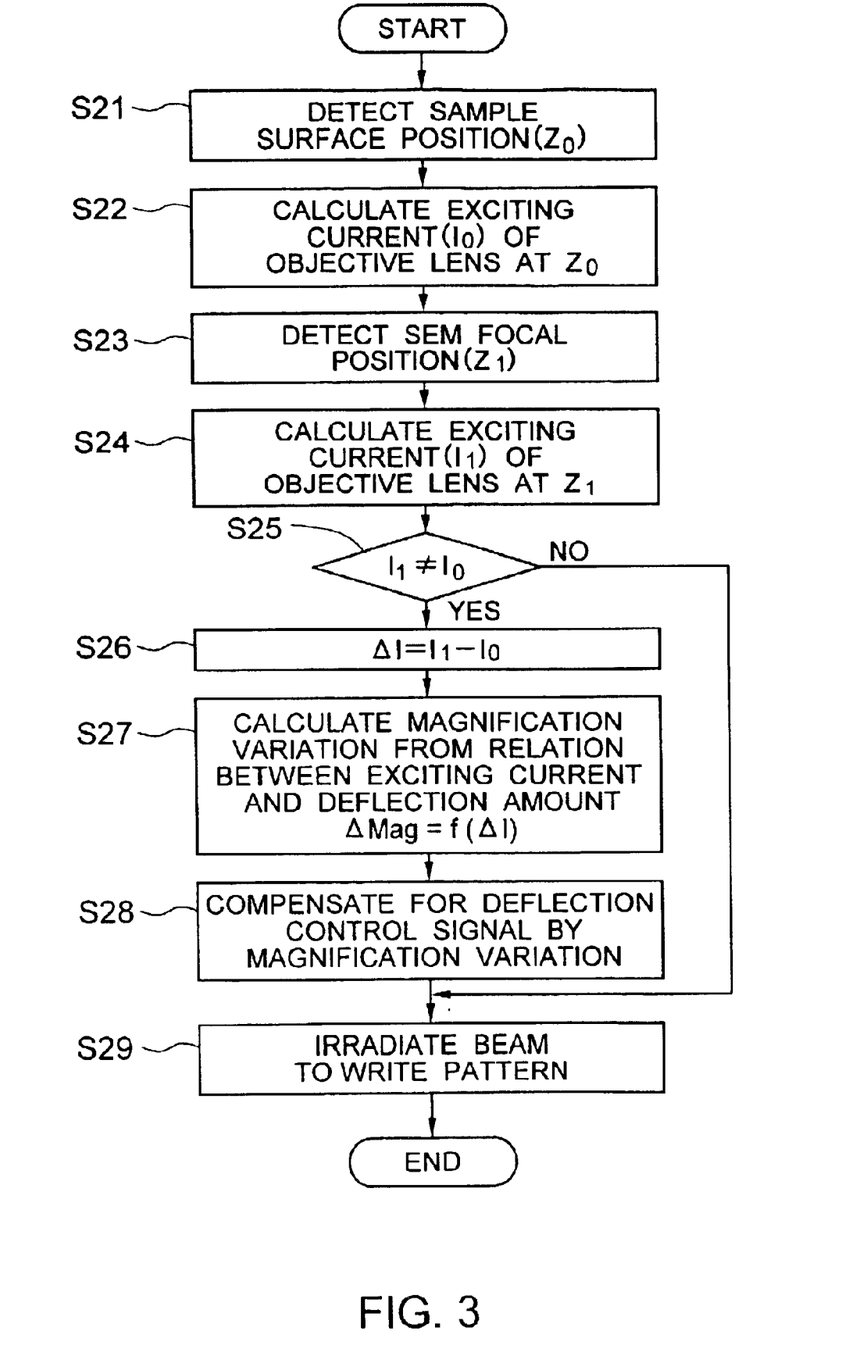
FIG. 3 is a flowchart showing the schematic steps of an embodiment of a pattern drawing method according to the present invention.

FIG. 3 is a flowchart showing the schematic steps of the pattern drawing method of this embodiment. As is apparent from the contrast of it with the flowchart shown in FIG. 2, the steps of the pattern drawing method of this embodiment are substantially the same as steps S1 to S8 of the pattern measuring method of the first embodiment except for step S29.

That is, the sample surface position $Z_0$ is detected by the sample height detector 18 (step S21). the exciting current $I_0$ of the objective lens 16 at the sample surface position $Z_0$ is calculated by the focus control current calculation part 24 on the basis of the relation between the sample surface position and the focus control current of the objective lens 16 (step S22).

Next, the focal position $Z_1$ of the electron beam EB is detected by the focal position detection part 28 while the focus control current of the objective lens 16 is being changed (step S23), the exciting current $I_1$ of the objective lens 16 at the position $Z_1$ being calculated (step S24).

The focus control current $I_0$ is compared with the focus control current $I_1$ by the focus control current differential calculation part 32 (step S25). In the case of $I_1=I_0$, it can be determined that no magnification error is caused. The electron beam EB is then irradiated to draw pattern while the exciting current $(I_1=I_0)$ is given to the objective lens 16 (step S29).

In contrast, in the case of $I_1 \neq I_0$, magnification compensation is performed. Its difference $\Delta I$ $(I_1-I_0)$ is calculate by the focus control current differential calculation part 32 (step S26). Magnification variation $\Delta Mag$ $(=f(\Delta I))$ corresponding to the difference $\Delta I$ is calculated by the magnification variation calculation part 34 from the relation between the value of the exciting current and the deflection amount using the prepared calibration parameter (step S27). Deflection control signal Scd corresponding to the magnification variation $\Delta Mag$ is generated by the deflection control part 36 to be supplied to the deflectors 14a, 14b, thereby the deflection amount being compensated by the magnification variation $\Delta Mag$ (step S28). In more specific the deflection amount W1 at the focal position of the electron beam EB is compensated to the deflection amount W0 corresponding to the sample surface position. As a result, the drawing magnification is the same as In the case in which the sample position is not varied imaginarily. Thereafter, a pattern is drawn on the surface of the sample at the drawing magnification (step S29).

According to this embodiment, the pattern can be drawn stably on the surface of the sample with stable and high precision.

(4) Second Embodiment of Charged Particle Beam Apparatus

Figure 4:
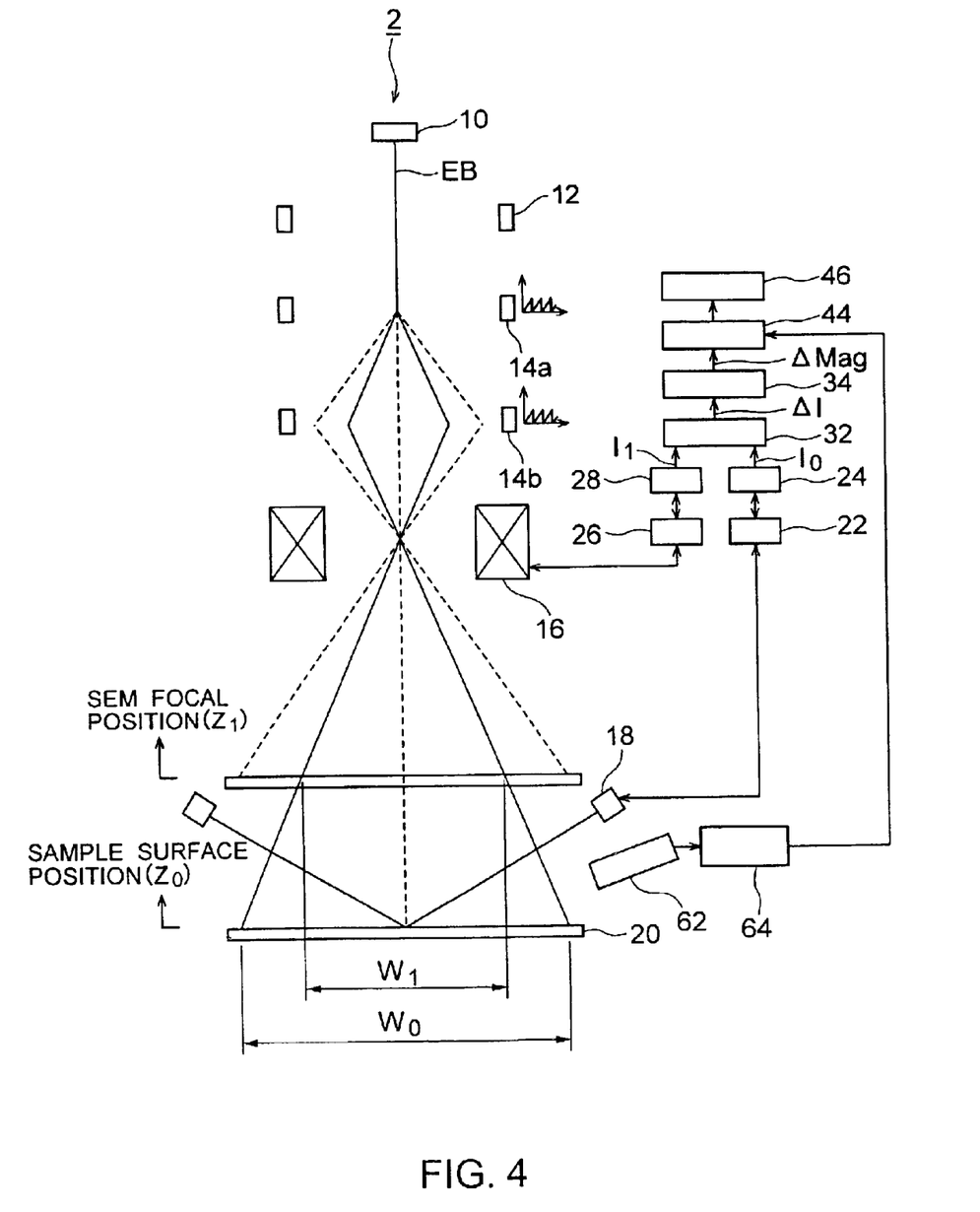
FIG. 4 is a block diagram showing the schematic construction of a second embodiment of a charged particle beam apparatus according to the present invention.

FIG. 4 is a block diagram showing the schematic construction of a second embodiment of a charged particle beam apparatus according to the present invention. An electron beam apparatus 2 shown in the drawing comprises a measured result compensation part 46 in place of the deflection control part 36 provided in the electron beam apparatus 1 shown in FIG. 1. The electron beam apparatus 2 also comprises a pattern measuring part 44 connected to the magnification variation calculation part 34 and the measured result compensation part 46, in place of the pattern measuring part 42. Other constructions of the electron beam apparatus 2 are substantially the same as the electron beam apparatus 1 shown in FIG. 1.

The pattern measuring part 44 uses the electron beam image obtained from the secondary electron detector 62 and the SEM image signal processing part 64 by irradiation of the electron beam EB to measure the size of a pattern, supplying the measured result to the measured result compensation part 46. The measured result compensation part 46 compensates for the measured result on the basis of information of the magnification variation ΔMag supplied from the magnification variation calculation part 34. Although this does not compensate for the observation magnification itself, the same measured result as that of the first embodiment can be obtained.

This embodiment solves the measured error due to the imaginary variation of the sample position caused by the variation in potential of the sample. When measuring the pattern size, stable and high-precision measurement can be realized.

(5) Second Embodiment of Pattern Measuring Method

A pattern size measuring method using the charged particle beam apparatus shown in FIG. 4 will be described below as a second embodiment of the pattern measuring method according to the present invention with reference to FIG. 5.

Figure 5:
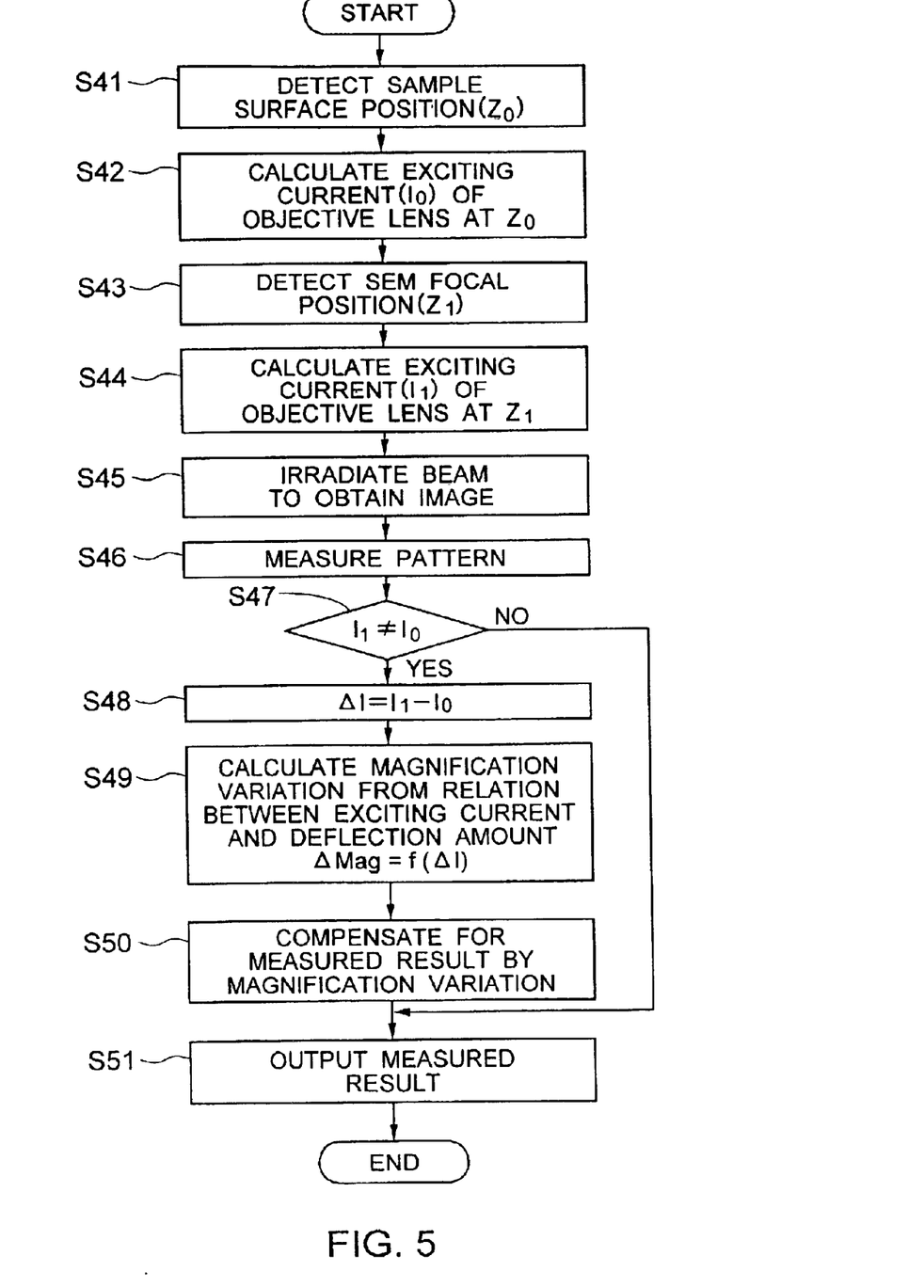
FIG. 5 is a flowchart showing the schematic steps of a second embodiment of a pattern measuring method according to the present invention.

FIG. 5 is a flowchart showing the schematic steps of the pattern size measuring method of this embodiment.

First, the sample surface position $Z_0$ is detected by the sample height detector 18 (step S41).

Next, the exciting current $I_0$ of the objective lens 16 at the sample surface position $Z_0$ is calculated by the focus control current calculation part 24 on the basis of the relation between the sample surface position and the focus control current of the objective lens 16 (step S42).

The focal position $Z_1$ of the electron beam EB is detected by the focal position detection part 28 while the focus control current of the objective lens 16 is being changed (step S43), the exciting current $I_1$ of the objective lens 16 at the position $Z_1$ being calculated (step S44).

Next, the electron beam EB is irradiated to obtain an electron beam image (step S45) and a pattern in the electron beam image is measured by the pattern measuring part 44 (step S46).

Then, the focus control current $I_0$ is compared with the focus control current $I_1$ by the focus control current differential calculation part 32 (step S47). In the case of $I_1=I_0$, it can be determined that no magnification error is caused. The measured result of the pattern measuring part 44 is outputted as-is (step S51).

On the contrary, in the case of $I_1 \neq I_0$ (step S47), the measured result is compensated by the following steps. A difference $\Delta I$ $(=I_1-I_0)$ between the focus control current $I_0$ and the focus control current $I_1$ is calculated by the focus control current differential calculation part 32 (step S48). Magnification variation $\Delta Mag$ $(=f(\Delta I))$ corresponding to the difference $\Delta I$ is calculated by the magnification variation calculation part 34 on the basis of the relation between the value of the exciting current and the deflection amount using the prepared calibration parameter to calculate (step S49). Sequentially, the measured result of the pattern size outputted from the pattern measuring part 44 is compensated by the measured result compensation part 46 on the basis of information of the magnification variation $\Delta Mag$ (step S50), the compensated measured result is then outputted as a final measured result (step S51). Although this does not compensate for the observation magnification itself, the same measured result as that of the first embodiment can be obtained.

This embodiment thus compensates for the measured result corresponding to the imaginary variation of the sample position caused by the variation in potential of the sample. Accordingly, stable and high-precision measurement can be realized.

Some embodiments of the present invention are described above. However, the present invention is not limited to the above embodiments and can be applied by various modifications within the scope thereof. In the above embodiments, the magnification variation ΔMag is described above as the function of the difference ΔI of the exciting current of the objective lens 16. Without being limited to this, it is apparent that the present invention can be applied when the magnification variation ΔMag is taken as the function of difference ΔV of a voltage applied to excite the objective lens 16.

What is claimed is:

1. A charged particle beam apparatus comprising:
   a charged particle source which generates a charged particle beam;
   condenser lens which converges the charged particle beam;
   deflector which deflects the charged particle beam to scan a sample with the charge particle beam;
   an objective lens which converges the charged particle beam on the surface of the sample;
   a sample position imaginary variation detection part which detects an imaginary variation of a sample position in height; and
   a sample position imaginary variation compensation part which compensates for said detected imaginary variation of the sample position;
   wherein the imaginary variation of the sample position is based upon a difference in potential associated with an actual sample height and an imaginary sample height, said imaginary sample height being associated with a focal position of the charged particle beam.

2. A charged particle beam apparatus according to claim 1, wherein
   said sample position imaginary variation detection part includes:
   a focal position adjustment part which adjusts the focal position of the charged particle beam by adjusting a current or a voltage given to said objective lens and outputs a focus control current value or a focus control voltage value for said objective lens when the charged particle beam is focused on the surface of the sample, as a first focus control current value or a first focus control voltage value, respectively;
   a height detector which detects the height of the surface of the sample;
   a focus control signal value calculation part which calculate a focus control current value or a focus control voltage value given to said objective lens when a focal position of the charged particle beam corresponds to the height of the surface of the sample detected by said height detector, as a second focus control current value or a second focus control voltage value, respectively;
   a focus control signal differential calculation part which calculates a focus control current difference which is a difference between said first focus control current value and said second focus control current value or a focus control voltage difference which is a difference between said first focus control voltage value and said second focus control voltage value; and
   a magnification variation calculation part which calculates a magnification variation of the charged particle beam on the basis of said focus control current difference or said focus control voltage difference,
   said sample position imaginary variation compensation part includes a deflection control part which generates a deflection control signal which compensates for a control signal to said deflectors in dependence upon said magnification variation supplied from said magnification variation calculation part to supply it to said deflectors.

3. A charged particle beam apparatus according to claim 2, wherein said magnification variation calculation part calculates said magnification variation using a calibration parameter obtained from the relation between the focus control current value of said objective lens and the deflection amount of said deflectors or the relation between the focus control voltage value of said objective lens and the deflection amount of said deflectors.

4. A charged particle beam apparatus according to claim 1, wherein a pattern is formed on the surface of the sample, and which further comprises a measuring part which measures the pattern on the surface of the sample on the basis of a secondary charged particle or a reflective charged particle which reproduced from the surface of the sample by irradiation of the charged particle beam, and wherein said sample position imaginary variation detection part includes:

a focal position adjustment part which adjusts the local position of the charged particle beam by adjusting a current or a voltage given to said objective lens and outputs a focus control current value or a focus control voltage value for said objective lens when the charged particle beam is focused on the surface of the sample, as a first focus control current value or a first focus control voltage value, respectively;

a height detector which detects the height of the surface of the sample;

a focus control signal value calculation part which calculate a focus control current value or a focus control voltage value given to said objective lens when a focal position of the charged particle beam corresponds to the height of the surface of the sample detected by said height detector, as a second focus control current value or a second focus control voltage value, respectively;

a focus control signal differential calculation part which calculates a focus control current difference which is a difference between said first focus control current value and said second focus control current value or a focus control voltage difference which is a difference between said first focus control voltage value and said second focus control voltage value; and a magnification variation calculation part which calculates magnification variation of the charged particle beam on the basis of said focus control current difference or said focus control voltage difference, said sample position imaginary variation compensation part includes a measured result compensation part which compensates for an error in measurement caused in the measured result from said measuring part due to the imaginary variation of the sample position on the basis of said magnification variation.

5. A charged particle beam apparatus according to claim 1, wherein the charged particle beam is an electron beam.

6. A charged particle beam apparatus according to claim 1, wherein the charged particle beam is an ion beam.

7. A pattern measuring method using a charged particle beam apparatus, said charged particle beam apparatus comprising a charged particle source which generates a charged particle beam, a condenser lens which converges the charged particle beam, deflector which deflects the charged particle beam for scanning a sample with the charged particle beam, an objective lens which converges the charged particle beam on the surface of the sample and a measuring part which measures a pattern formed on the surface of the sample on the basis of a secondary charged particle or a reflective charged particle which are produced from the surface of the sample by irradiation of the charged particle beam, said method comprises:

detecting an imaginary variation of a sample position in height; and compensating for the imaginary variation of the sample position;

wherein the imaginary variation of the sample position is base upon a difference in potential associated with an actual sample height and an imaginary sample height, said imaginary sample height being associated with a focal position of the charged particle beam.

8. A pattern measuring method according to claim 7, wherein detecting the imaginary variation of the sample position includes:

adjusting the focal position by adjusting a current or a voltage given to said objective lens to search the focal position of the charged particle beam and obtaining a focus control current value or a focus control voltage value of said objective lens when the charged particle beam is focused on the surface of the sample, as a first focus control current value or a first focus control voltage value, respectively;

detecting the height of the surface of the sample;

obtaining a focus control signal value by calculating a focus control current value or a focus control voltage value given to said objective lens when a focal position of the charged particle beam corresponds to the detected height of the surface of the sample, as a second current value or a second voltage value, respectively;

calculating a control current difference which is a difference between said first control current value and said second control current value or a control voltage difference which is a difference between said first control voltage value and said second control voltage value; and calculating a magnification variation of the charged particle beam on the basis of said control current difference or said control voltage difference, and wherein compensating for the imaginary variation of the sample position includes compensating for the deflection amount of said deflectors in response to said calculated magnification variation.

9. A pattern measuring method according claim 8, wherein said magnification variation is calculated using a calibration parameter obtained from the relation between the focus control current value of said objective lens and the deflection amount of said deflectors or the relation between the focus control voltage value of said objective lens and the deflection amount of said deflectors.

10. A pattern measuring method according to claim 7, wherein detecting the imaginary variation of the sample position includes:

adjusting a focal position of the charged particle beam by adjusting a current or a voltage given to said objective lens to search the focal position of the charged particle beam and obtaining a focus control current value or a focus control voltage value for said objective lens when the charged particle beam is focused on the surface of the sample, as a first focus control current value or a first focus control voltage value, respectively;

detecting the height of the surface of the sample;

obtaining a focus control signal value by calculating a focus control current value or a focus control voltage value given to said objective lens when a focal position of the charged particle beam corresponds to the detected height of the surface of the sample, as a second current value or a second voltage value, respectively;

calculating a focus control current difference which is a difference between said first focus control current value and said second focus control current value or a focus control voltage difference which is a difference between said first focus control voltage value and said second focus control voltage value; and calculating a magnification variation of the charged particle beam on the basis of said focus control current difference or said focus control voltage difference, and wherein compensating for the imaginary variation of the sample position includes compensating for an error in measurement caused in the measure result of said measuring part due to the imaginary variation of the sample position the basis of said magnification variation.

11. A pattern measuring method according to claim 7, wherein the charged particle beam is an electron beam.

12. A pattern measuring method according to claim 7, wherein the charged particle beam is an ion beam.

13. A method for drawing a patter on a surface of a sample using a charged particle beam apparatus, said charged particle beam apparatus comprising a charged particle source which generates a charged particle beam, a condenser lens which converges the charged particle beam, a deflector which deflects the charged particle beam to scan the-sample with the charged particle beam, and an objective lens which converges the charged particle beam on the surface of the sample, said method comprises:

adjusting a focal position of the charged particle beam by adjusting a current or a voltage given to said objective lens to search the focal position of the charged particle beam and obtaining a focus control current value or a focus control voltage value for said objective lens when the charged particle beam is focused on the surface of the sample, as a first focus control current value or a first focus control voltage value, respectively;

detecting the height of the surface of the sample;

calculating a focus control current value or a focus control voltage value given to said objective lens when a focal position of the charged particle beam corresponds to the detected height of the surface of the sample, as a second current value or a second voltage value, respectively;

calculating a focus control current difference which is a difference between said first focus control current value and said second focus control current value due to a potential of the sample or a focus control voltage difference which is a difference between said first focus control voltage value and said second focus control voltage value due to the potential of the sample;

calculating a magnification variation of the charged particle beam on the basis of said focus control current difference or said focus control voltage differential;

generating a deflection control signal as a compensation signal which compensates for a control signal to said deflectors corresponding to said calculated magnification variation; and drawing a pattern on the sample with the charged particle beam while compensating for the deflection amount of said deflectors on the basis of said deflection control signal;

wherein the focus current control difference is based upon a variation in potential between an actual sample height and an imaginary sample height; said imaginary sample height being associated with a focal position of the charged particle beam.

14. A pattern drawing method according to claim 13, wherein said magnification variation is calculated using a calibration parameter obtained from the relation between the focus control current value of said objective lens and the deflection amount of said deflectors or the relation between the focus control voltage value of said objective lens and the deflection amount of said deflectors.

15. A pattern drawing method according to claim 13, wherein the charged particle beam is an electron beam.

16. A pattern drawing method according to claim 13, wherein the charged particle beam is an ion beam.

17. A pattern measuring method using a charged particle beam, said method comprising:

detecting a height of a surface of a sample on which a pattern to be measured is formed;

calculating a first focal position of the charged particle beam corresponding to the detected height of the surface of the sample;

adjusting the focal position of the charged particle beam to the surface of the sample as a second focal position;

calculating the difference between the first focal position and the second focal position;

calibrating a distortion in a charged particle beam image including magnification error which may occur depending on the difference between the first focal position and the second focal position when the first and second focal positions are different from each other due to a potential of the sample;

wherein the difference is based upon a variation in potential between an actual sample height and an imaginary sample height; said imaginary sample height being associated with a focal position of the charged particle beam.

* * * * *

UNITED STATES PATENT AND TRADEMARK OFFICE
CERTIFICATE OF CORRECTION

PATENT NO. : 6,797,965 B2  Page 1 of 1
DATED : September 28, 2004
INVENTOR(S) : Abe It is certified that error appears in the above-identified patent and that said Letters Patent is hereby corrected as shown below:

Column 8,
Line 15, change "charge" to -- charged --.
Lines 43-44, change "calculate" to -- calculates --.

Column 9,
Line 14, change "reproduced" to -- are produced --.
Line 18, change "local" to -- focal --.
Lines 28-29, change "calculate" to -- calculates --.

Column 10,
Line 8, change "base" to -- based --.
Line 45, change "according claim" to -- according to claim --.

Column 11,
Line 15, change "measure" to -- measured --.
Line 22, change "patter" to -- pattern --.
Line 27, change "the-sample" to -- the sample --.

Signed and Sealed this

Eighth Day of February, 2005

JON W. DUDAS
*Director of the United States Patent and Trademark Office*